United States Patent [19]
Lichner

[11] Patent Number: 6,102,784
[45] Date of Patent: Aug. 15, 2000

[54] METHOD AND APPARATUS FOR IMPROVED GEAR CLEANING ASSEMBLY IN POLISHING MACHINES

[75] Inventor: Christopher J. Lichner, Phoenix, Ariz.

[73] Assignee: SpeedFam-IPEC Corporation, Chandler, Ariz.

[21] Appl. No.: 08/964,975

[22] Filed: Nov. 5, 1997

[51] Int. Cl.[7] .................................................. B24B 1/00
[52] U.S. Cl. .................. 451/262; 451/288; 451/444; 451/271
[58] Field of Search ........................ 451/446, 288, 451/449, 53, 270, 271, 291; 239/251, 252, 271

[56] References Cited

U.S. PATENT DOCUMENTS

| | | |
|---|---|---|
| 4,216,630 | 8/1980 | Smart et al. . |
| 4,481,741 | 11/1984 | Bouladon et al. . |
| 4,665,658 | 5/1987 | Carsey . |
| 4,910,155 | 3/1990 | Cote et al. . |
| 4,991,358 | 2/1991 | Giebmanns . |
| 5,113,622 | 5/1992 | Nishiguchi et al. . |
| 5,534,106 | 7/1996 | Cote et al. . |
| 5,554,065 | 9/1996 | Clover . |
| 5,562,524 | 10/1996 | Gill, Jr. . |
| 5,593,537 | 1/1997 | Cote et al. . |

FOREIGN PATENT DOCUMENTS

| | | | |
|---|---|---|---|
| 1018929 | 1/1953 | France | ..................................... 451/271 |
| 309319 | 11/1918 | Germany | ................................ 451/271 |

*Primary Examiner*—David A. Scherbel
*Assistant Examiner*—George Nguyen
*Attorney, Agent, or Firm*—Laura J. Zeman; Snell & Wilmer, L.L.P.

[57] ABSTRACT

An improved gear or pin cleaning assembly for polishing or grinding machines having a rotating plate is presented. One or more nozzle members are positioned within the rotating plate and a source of fluid, such as deionized water, is connected to the nozzle or nozzles to emit a pressurized stream of fluid which rinses off the gear assembly as the plate rotates. The rotating plate may contain a channel for delivering the fluid from the exterior or interior of the plate to the nozzle(s).

14 Claims, 4 Drawing Sheets

METHOD AND APPARATUS FOR IMPROVED GEAR CLEANING ASSEMBLY IN POLISHING MACHINES

FIELD OF THE INVENTION

The present invention generally relates to an improvement in polishing machines which incorporate a rotating plate, and specifically to a method and apparatus for an improved gear cleaning assembly in such polishing machines. More particularly, the present invention relates to a method and apparatus for automatically spray cleaning the pins or gears in double sided polishers in machines for polishing nickel plated hard disks. The method and apparatus is generally incorporated and employed to prevent the build-up of slurry and/or nickel particles on the gears or pins of polishing machines where the surface of a workpiece, such as computer hard disks and the like, are polished. However, the method and apparatus for automatically spray cleaning pins or gears may also be used in grinding machines.

BACKGROUND OF THE INVENTION

In a typical polishing machine, there are usually two opposing plates, an upper plate and a lower plate. These plates are typically ring-shaped having an inner circumference and an outer circumference. A central rotary gear, sometimes referred to as a "sun" gear, is positioned within the inner circumference of the plates and a fixed external gear, sometimes referred to as a "ring" gear, is positioned about the outer circumference of the plates. Polishing pads are secured to the upper and lower plates to polish workpieces such as nickel plated aluminum disks. The polishing pads comprise a soft felt-like material such as that manufactured by Rodel as product Politex DG. Workpiece carriers having a plurality of teeth about their peripheries mesh on the fixed external gear and on the central rotary gear and are thereby rotated between the plates so that each of the workpieces contained in the carriers are subject to a cyclical movement independent of the movement of the polishing plates. The combined cyclical movements of the carriers and the plates effects a maximum uniform machining of the workpieces with the aid of an abrasive which can be placed between the plates. The abrasive may be suspended in a fluid to form a slurry, such as an aluminum oxide slurry, which functions in polishing the workpiece by entering through holes in the upper plate.

The polishing machines, which contain pins or gears for turning the workpiece carriers, must undergo frequent maintenance to ensure their mechanical structure is continuous in order to continue to provide for the uniform machining of workpieces. During processing of the workpieces, the nickel/slurry build-up created from the polishing action slurry flow can build up on the polishing surface and spill over into the pin or gear assemblies which drive the rotation of the workpiece carriers.

Typical grinding machines comprise much of the same structure as the polishing machine, such as opposing upper and lower grinding plates, a central rotary gear, and a fixed external gear. However, the upper and lower grinding plates are much thinner and instead of a polishing pad, grinding machines use segmented stone pieces which are attached to aluminum mounting plates that are secured to the upper and lower grinding plates in order to process the workpieces.

Abrasive foam grinding structures generally known as "honing stones", and more particularly known as "polyvinyl alcohol (PVA) stones" are used in grinding machines to grind or hone the surface of a workpiece. PVA stones typically have open cell structures or closed cell structures. Stones having an open cell structure are generally made from a combination of polyvinyl alcohol (PVA), starch, and a silicon carbide filler functioning as the abrasive material. An appropriate catalyst, for example sulfuric acid and/or formaldehyde, is then added to the PVA, starch and silicon carbide mixture to convert the mixture to a rubber-like mass with starch particles randomly entrained therein. The starch may then be flushed out from the composite with hot water and the remaining material may be impregnated with a stiffening agent.

When used to hone or grind workpieces, open-cell stones typically flake, liberating particulates at the stone-workpiece interface. Accordingly, the workpieces are typically flushed with water or a water-based solution during processing to remove the stone particulates and particulates liberated from the workpiece and to cool the interface which is heated by the grinding process.

Prior art references do exist which address some of the problems associated with polishing and grinding machines such as the heat created at the polishing or grinding interface and the slurry build-up at that same interface between the stone or pad and the workpiece. For example, U.S. Pat. No. 4,481,741 issued to Bouladon et al. describes a polishing machine having a rotating plate that is heat conditioned with the aide of nozzles disposed in the bottom of a tank for spraying a liquid against the lower face of the plate. In the Bouladon et al. apparatus, the plate is disposed inside of the tank and the nozzle is located in the bottom of the tank so that it can spray a liquid against the lower base of the plate. Further, U.S. Pat. No. 5,113,622 issued to Nishiguchi et al. describes an apparatus for grinding a semi-conductor workpiece which has a rotatable work stage. The apparatus has an inlet flow path for guiding cooling liquid to a grinding surface of the grinding wheel in order to perform cooling and an outlet flow path for collecting the cooling liquid which flows onto the work stage. The apparatus is also capable of detecting a temperature of the recovered cooling liquid by a temperature detector which is disposed in the outlet flow path. The rotational speed of the grinding wheel or the rotary table is then controlled based upon the temperature of the cooling liquid that is measured in the outlet flow path.

U.S. Pat. No. 4,991,358 issued to Giebmans describes a grinding machine with a grinding wheel which has a cooling medium storage tank that conducts a cooling medium via a nozzle to a contact region between the grinding wheel and a workpiece mounted on the workpiece table. As indicated in the previously described prior art references, this prior art reference addresses the problem of cooling the interface between the workpiece and the grinding stone in order to decrease the heat created as a result of the friction between the workpiece and the grinding stone.

Further, U.S. Pat. No. 4,216,630 issued to Smart et al. discloses a grinder apparatus with a pollution control fluid dispensing means. More particularly, this patent reference discloses nozzles which atomize water particles that are then directed toward a workpiece upon which a grinding operation is being performed. The nozzles are located adjacent the grinding tool and are aimed at the region of the grinding tool at which the particulate contaminants are generated in order to capture respirable micron and sub-micron sized particulate contaminates generated by the grinding operation. This patent reference is specifically directed toward removing respirable contaminants which are generated as a result of the grinding.

The prior art addresses the use of flushing the workpieces with a coolant to cool the grinding stone/workpiece interface and remove particulates from that interface. However, the nickel/slurry build-up in the pin or gear teeth assemblies can cause the uneven wearing of the gear teeth on the workpiece carriers which can ultimately result in a nonuniform machining of a workpiece. Further, slurry build-up will result in increased wear and tear on the pins or gears of the machines and the potential failure and/or shut down of the machines, especially the polishing machines. Accordingly, there is a need for a method and apparatus for removing the nickel/slurry build-up during polishing, and any other particulate build-up during grinding, from the pin or gear teeth assemblies which drive the rotation of the workpiece carriers.

SUMMARY OF THE INVENTION

It is a principal object of the present invention to provide a method and apparatus for an improved gear cleaning assembly in polishing machines.

It is another object to the present invention to provide a method and apparatus for cleaning the pins or gears in polishing machines to ensure uniform wearing of the pins or gears and, consequently, the uniform machining of workpieces using the polishing machine.

It is still another object of the present invention to provide a method and apparatus for automatically spray cleaning the pins or gear teeth in grinding machines used for grinding hard disks and polishing machines used for polishing nickel plated hard disks in order to maintain a uniform surface on the pins or gear teeth and increase their structural longevity.

It is yet another object of the present invention to provide a polishing machine requiring less mechanical maintenance then those existing polishing machines.

Still another object of the present invention is to provide a method and apparatus for preventing excess slurry and/or nickel particles from entering into the surface of grinding structures used in grinding machines or the polishing structures used in polishing machines.

The present invention is directed to a gear assembly cleaning apparatus for cleaning pins or gears in polishing machines or grinding machines having at least one rotating plate. The gear cleaning assembly includes at least one nozzle located within the rotating plate and means for supplying the nozzle with a cleaning fluid such as deionized water. The nozzle emits a pressurized stream of fluid onto the pins or gear teeth to rinse slurry and other build-up from the pins or gear teeth. A channel is preferably machined into the rotating plate such that it is connected to the nozzle(s) and a water jacket and tubing are used to direct the cleaning fluid from the supply source to the channel in the rotating plate. The nozzles are preferably rotatable in order to adjust the direction of the pressurized stream.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EMBODIMENT

The subject invention relates, generally, to an improved gear cleaning assembly in polishing machines for use in processing workpiece surfaces. Although the workpiece to be processed may comprise virtually any article requiring a controlled finish, the present invention is conveniently described with reference to computer hard disks which require controlled surface finishes. It will be understood, however, that the invention is not limited to any particular type of workpiece or any particular type of surface finish.

Figure 1:
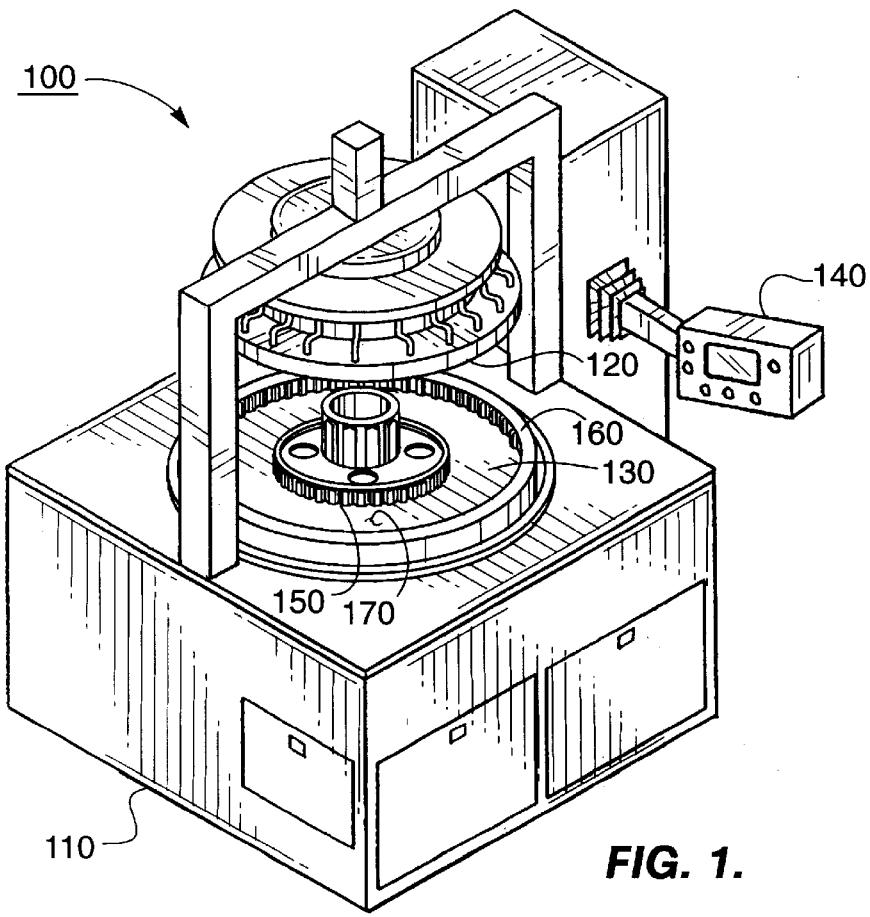
FIG. 1 is a perspective view of a double sided flat polishing machine.
Figure 2:
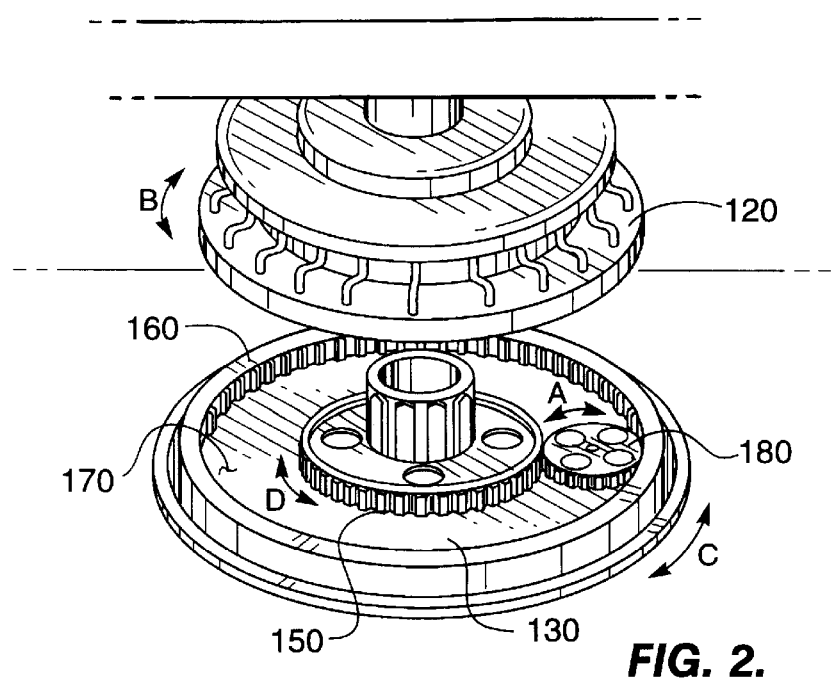
FIG. 2 is an exploded perspective view of the upper portion of the polishing machine of FIG. 1.

Referring now to FIGS. 1 and 2, an exemplary double-sided polishing machine 100 is shown. Polishing machine 100 is configured to remove material from a workpiece (not shown in FIGS. 1 and 2), and suitably comprises a base 110, an upper platen 120, a lower platen 130 and a control panel 140 which is used to change parameters or operate the polishing apparatus. A sun gear 150, and a ring gear 160 are located at inner and outer circumferences of the lower platen 130, respectively. Each of platens 120 and 130 includes an abrasive material 170, (e.g., an abrasive stone in the case of a grinding machine or a slurry in the case of a polishing machine) fixably attached to one of its surfaces.

Referring now to FIG. 2, one or more workpieces to be polished are suitably placed in a disk carrier 180 between the polishing pads 170 present on upper platen 120 and lower platen 130. Upper platen 120 is then lowered onto the workpiece, so that polishing pad 170 on the upper platen 120 and polishing pad 170 on the lower platen 130 contact both sides of each workpiece. Polishing occurs when the upper platen 120 and lower platen 130 are moved relative to the workpiece. In addition, an abrasive is typically present during polishing to enhance the stock removal and finish of the workpiece. Also, a coolant such as deionized water is typically added during processing to help flush debris from the surface of the gears or pins. In current polishing machines, this deionized water is supplied via an elevated non-rotating tube connected to the table which drips onto the work table. No elevated pressure stream of water is implemented. This is in contrast to the improved cleaning gear assembly of the present invention which is described in further detail with reference to FIGS. 5 and 6.

Polishing pads 170 on platens 120, 130 suitably comprise a soft, foldable material. Examples of suitable polishing pads are Politex DG manufactured by Rodel in Scottsdale, Ariz. The polishing pads 170 are secured to the upper and lower platens 120, 130 with a sticky, adhesive type material thereby preventing them from moving when normal operating stresses occur. For optimum finishing of each workpiece in carrier 180, is it desirable that the surface of each polishing pad 170 be uniform and free from defects.

In a preferred embodiment of the present invention, one or more workpieces are placed in carrier 180 during processing. Carrier 180 is configured to rotate, orbit, or a combination thereof across polishing pad 170. In addition, platens 120, 130 containing polishing pads 170 are also rotated at various speeds during polishing to enhance the stock removal, the flatten and the finish of the workpieces. The rotation of carrier 180 and platens 120, 130 are indicated by arrows A, B, and C respectively. Moreover, if sun gear 150 and ring gear 160 (i.e., the gears that cause carrier 1 80 to rotate in orbit) rotate at different speeds, i.e., at different radians per minute, carrier 180 will orbit or translate around the polishing pad as indicated by arrow D. As a result, both oppositely disposed surfaces of each workpiece are processed simultaneously, so that a uniform and predictable removal rate from each side is achieved.

In order to obtain the optimum polishing of each workpiece, it is desirable that the mechanical surface of each polishing pad 170 be uniform across their entire surface. Furthermore, it is desirable to maintain uniform mechanical structure characteristics of each of the pins or gear teeth which drive the rotation of the gears in that the sun and ring gears 150, 160 also travel up and down to even the wear over the gears. When nickel and slurry build up on the gear assemblies, teeth on the carrier 180 can break off and build-up on the gears can flake off causing scratches on the workpiece. Further, nickel and slurry build-up from the gears can enter the polishing surface which will also cause scratches on the workpiece. Slurry which gets caught between the pin and sleeve can also bind up the pin assembly and cause it to lock.

The improved gear cleaning assembly of the present invention prevents these types of problems by providing for the adequate cleaning of the pins or gear teeth as described with reference to FIGS. 5 and 6.

Figure 3:
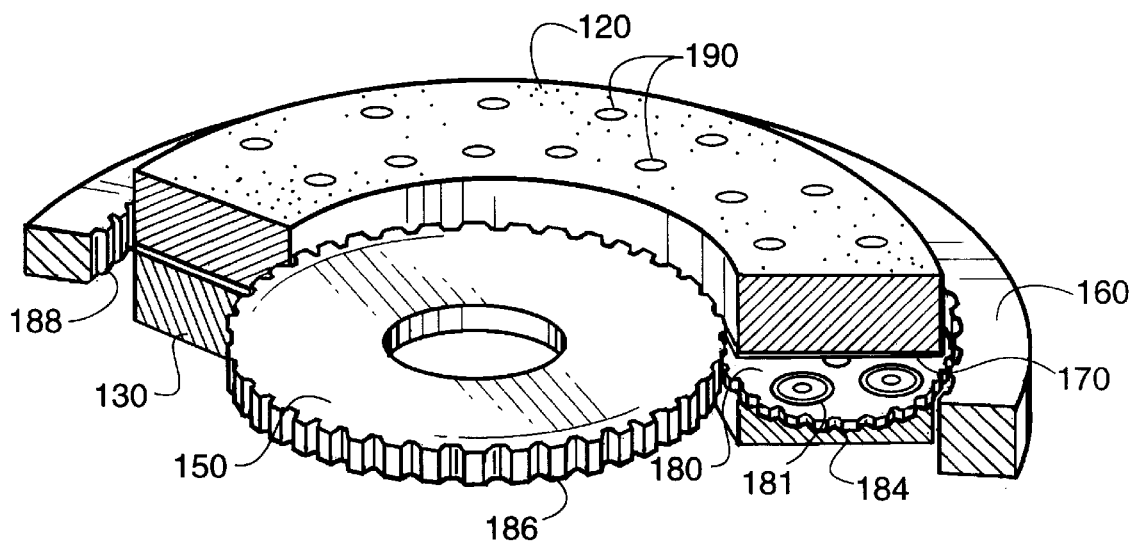
FIG. 3 is a partial cross-sectional view showing the upper and lower plates of a polishing machine position during polishing.

FIG. 3 shows a partial cross-sectional view of the polishing machine shown in FIGS. 1 and 2 during polishing. The workpiece carrier 180 carries workpieces 181 for polishing. The workpiece carrier 180 rotates by having its teeth 184, which are located about its perimeter, engage with the pins or gear teeth 186 of the sun gear 150 and the pins or gear teeth 188 of the ring gear 160. Apertures 190 are contained in the upper platen 120 to allow an abrasive slurry to be fed between the upper and lower platens 120, 130 and onto the surfaces of the workpieces 181.

Figure 4:
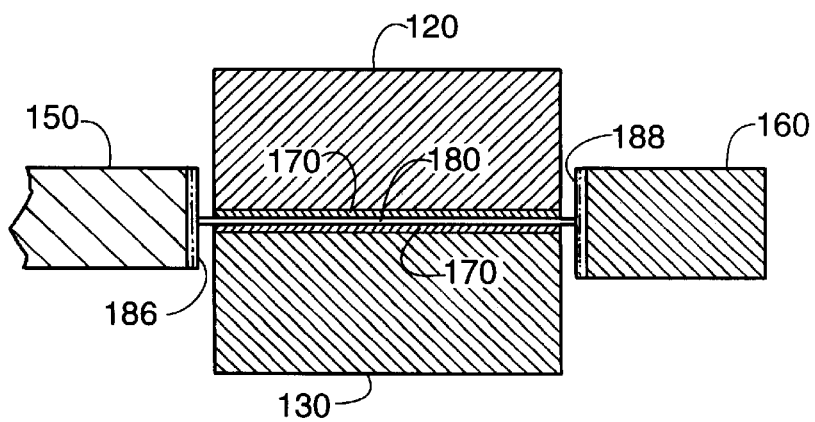
FIG. 4 is a cross-sectional view taken along lines 4—4 of FIG. 3.

A cross-sectional view of FIG. 3 taken along line 4—4 is shown in FIG. 4. FIG. 4 clearly depicts the engagement of the pins or gears 184 of the workpiece carrier 1 80 with the pins or gear teeth 186, 188 of the sun gear 150 and the ring gear 160, respectively. The level of the sun gear 150 and ring gear 160 index after each machine polishing cycle to even the wear on themselves.

Figure 5:
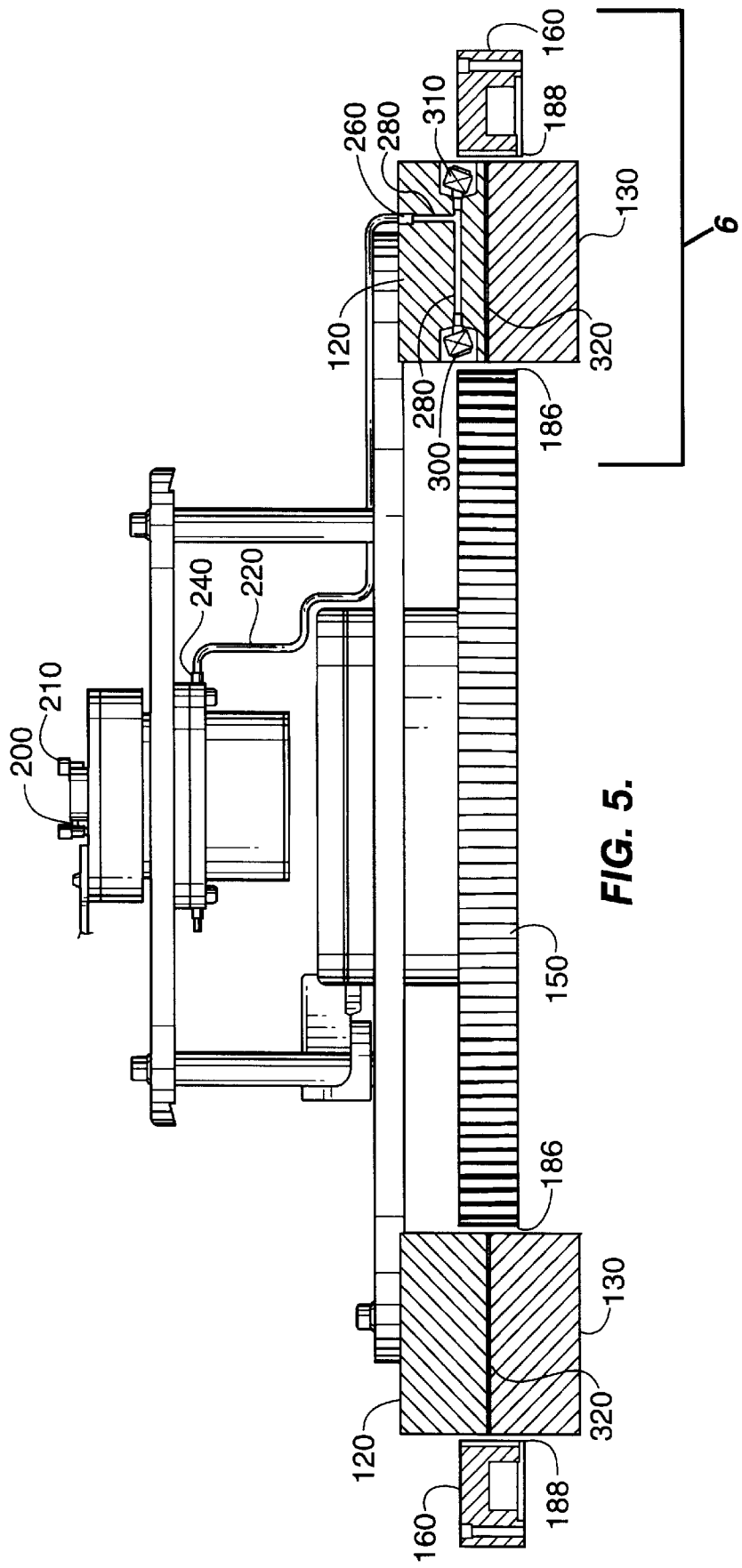
FIG. 5 is a cross sectional view of a double sided flat polishing machine showing a universal joint water jacket connected to the polishing machine.

Turning now to FIG. 5, there is shown a cross-sectional view of a double sided polishing machine showing a universal joint water jacket 200 connected to the polishing machine. Deionized water enters the universal joint 200 at port 210. The deionized water is directed to the upper platen 120 via a flexible tubing 220 having first and second ends 240 and 260, respectively. The first end 240 of the tubing 220 is connected to the universal joint water jacket 200 and the second end 260 of the tubing 220 is connected to a top of the upper platen 120.

The upper platen 120 is modified to further comprise a machined path 280 and a pair of nozzles 300, 310 recessed within the upper platen 120 at inner and outer diameters of the upper platen 120, respectively, which arc connected to the machined path 280. The deionized water which enters port 210 travels through the universal joint water jacket 200, through the flexible tubing 220, through the machined path 280 contained within the upper platen 120, and onto and through the nozzles 300, 310.

The machined path 280 begins at the top of the upper platen 120 and travels downward within the upper platen 120 before it branches into opposite directions at a "T" intersection and onto both of the nozzles 300, 310 located at inner and outer diameters of the upper platen 120, respectively.

The nozzles 300, 310 increase the pressure of the deionized water to form an increased pressure stream which exits the nozzles 300, 310. The deionized water is preferably pressurized within a range of about twenty (20) to sixty (60) pounds per square inch (PSI). The nozzle 300 which is recessed near the inner diameter of the upper platen 120 sprays a pressurized stream of deionized water onto the pins or gear teeth 1 86 of the sun gear 150 to rinse the pins or gear teeth of nickel and slurry buildup. Similarly, the nozzle 310 near the outer diameter of the upper platen 120 sprays a pressurized stream of deionized water onto the pins or gear teeth 188 of the ring gear 160 to rinse the pins or gear teeth of nickel and slurry build-up. The nozzles 300, 310 are rotatable to facilitate the proper positioning of the pressurized water stream in order to adequately rinse the gears or pins 186, 188 of the sun gear 150 and the ring gear 160, respectively.

Figure 6:
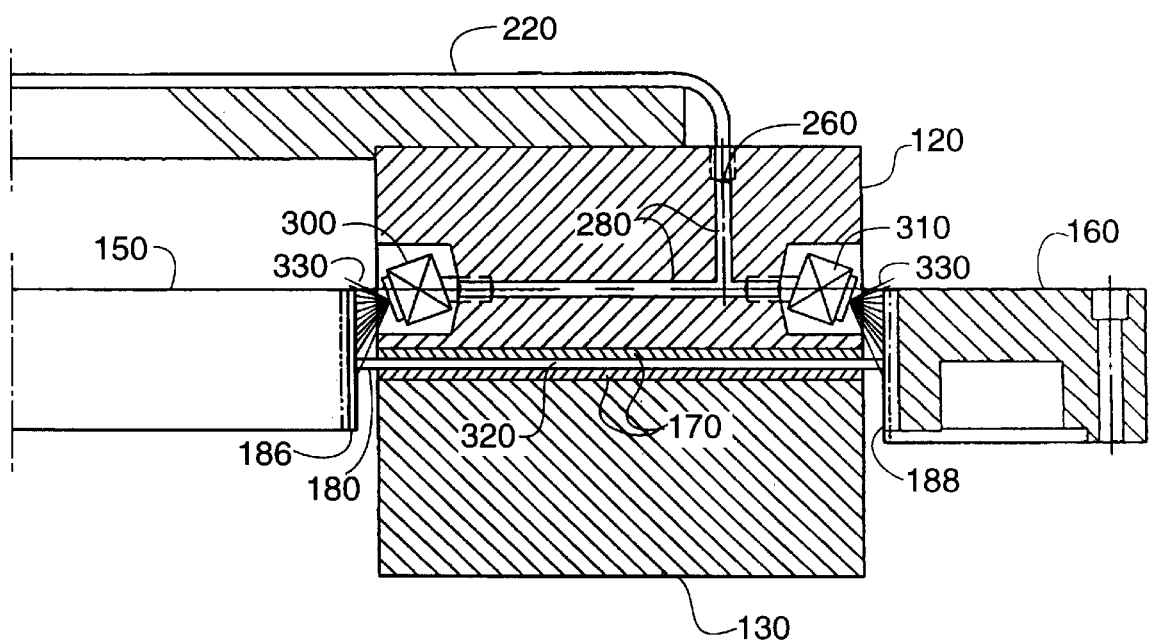
FIG. 6 is a partial enlarged view of the upper and lower platens of the cross sectional view of the polishing machine shown in area 5 of FIG. 5.

FIG. 6 is a partial enlarged view of area 5 shown in FIG. 5. The upper platen 120 and the lower platen 130 are shown adjacent to one another in a closed position. The carrier 180 is positioned within space 320 which is located between the sun and ring gears 150, 160 and between polishing pads 170 located on the upper and the lower platens 120, 130. When the upper platen 120 is lowered into a closed position directly above the lower platen 130, the nozzles 300, 310 contained within the upper platen 120 are in position to rinse slurry build-up and debris from the pins or gear teeth 186, 188 of the sun and ring gears 150, 160.

It will be understood by those skilled in the art that the nozzles 300, 310 may be automatically controlled to adjust their rotatable position to ensure maximum and thorough cleaning of the gears with the pressurized spray stream 330 that is emitted from the nozzles 300, 310. T he nozzles 300,310 may also be controlled to enable spray to be emitted from either one, both, or none of the nozzles 300, 310. Further, the automatic gear cleaning assembly previously described in detail may also be used in conjunction with, and/or incorporated into, the rotating plate of a grinding machine.

The foregoing is considered as illustrative only of the principles of the invention. Various modifications may be made in the design, arrangement, and type of elements disclosed herein, as well as the steps of using the invention without departing from the scope of the invention as expressed in the appended claims. Accordingly, all suitable modifications and equivalents fall within the scope of the invention.

I claim:

1. A gear assembly cleaning apparatus for cleaning gears or pins in polishing or grinding machines having a rotating polishing or grinding plate comprising:

at least one recess located in the periphery of said rotating plate;

at least one nozzle member located within said recess; and means for providing a fluid to said nozzle.

2. The gear assembly cleaning apparatus of claim 1 wherein said gear cleaning assembly comprises first and second nozzle members, said first nozzle member being recessed within said rotating plate near an inner diameter of the rotating plate and said second nozzle member being recessed within said rotating plate near an outer diameter of the rotating plate.

3. The gear assembly cleaning apparatus of claim 1 wherein said means for providing a fluid to said nozzle comprises:

a water jacket which is supplied with a source of fluid;

a channel located within said rotating plate connecting an outer surface of said plate to said at least one nozzle member; and a tubing member connecting the water jacket to the channel at the outer surface of the plate.

4. The gear assembly cleaning apparatus of claim 1 wherein said nozzle is capable of emitting a pressurized stream of fluid.

5. The gear assembly cleaning apparatus of claim 1 wherein said fluid is deionized water.

6. The gear assembly cleaning apparatus of claim 1 wherein said nozzle is rotatable.

7. A gear assembly cleaning apparatus for cleaning gears in polishing or grinding machines having rotating upper and lower polishing or grinding plates, said cleaning apparatus comprising:

a first nozzle member located within a recess within the upper plate near an inner periphery of said upper plate;

a second nozzle member located within recess within the upper plate near an outer periphery of said upper plate;

a channel located in an interior of said upper plate connecting an outer upper surface of said upper plate to said first and second nozzle members; and means for supplying a fluid to said channel at the outer upper surface of the upper plate.

8. The gear assembly cleaning apparatus of claim 7 wherein said means for supplying a fluid comprises:

a water jacket which is supplied with a source of fluid; and a tubing member connecting the water jacket to the channel at the outer surface of the upper plate.

9. The gear assembly cleaning apparatus of claim 7 wherein said first and second nozzle members are capable of emitting a pressurized stream of fluid.

10. The gear assembly cleaning apparatus of claim 7 wherein said fluid is deionized water.

11. The gear assembly cleaning apparatus of claim 7 wherein said first and second nozzle members are rotatable.

12. A method for cleaning a gear assembly in a polishing or grinding machine having a rotating polishing or grinding plate comprising the steps of:

providing a recess located within the periphery in within said rotating plate;

providing a nozzle member in said recess; and supplying a fluid to said nozzle member.

13. The method of claim 12 further comprising the step of emitting a pressurized fluid from said nozzle member to form a pressurized stream of fluid.

14. The method of claim 13 further comprising the step of rotating said nozzle member such that the pressurized stream of fluid rinses of the gear assembly.

\* \* \* \* \*